United States Patent [19]

Reitz

[11] 4,222,814

[45] Sep. 16, 1980

[54] METHOD FOR FORMING A CRYSTALLINE FILM FOR A PARAMAGNETIC SODIUM THALLIUM TYPE INTERMETALLIC COMPOUND

[75] Inventor: Norman E. Reitz, Redwood City, Calif.

[73] Assignee: Sotek Corporation, Palto Alto, Calif.

[21] Appl. No.: 872,625

[22] Filed: Jan. 26, 1978

[51] Int. Cl.$^2$ .................... B01J 17/06; B01J 17/30
[52] U.S. Cl. .................... 156/612; 148/108; 156/600; 156/DIG. 61; 156/DIG. 63; 156/DIG. 64; 156/DIG. 71; 156/DIG. 77; 156/DIG. 92
[58] Field of Search ............. 156/600, 603, 610, 612, 156/DIG. 64, DIG. 61, DIG. 62, DIG. 71, DIG. 77, DIG. 92; 148/103, 108

[56] References Cited

U.S. PATENT DOCUMENTS

| 3,956,031 | 5/1976 | Marcus ................................. 148/103 |
| 3,977,917 | 8/1976 | Fujimura et al. ..................... 148/103 |
| 4,042,447 | 8/1977 | Reitz .................................... 156/610 |

OTHER PUBLICATIONS

Yao; "Magnetic Susceptibility ... ", 12-1964, Transactions of Metal: Soc. of AIME, vol. 230, p. 1725.
Smerkovich-Galevy, "Effect of Magnetic Field ... ", Zhurnal ... Mendellva, vol. 22, p. 102, 1977.
Tyndall, "On Diamagnetism ... ", 1870.

*Primary Examiner*—Bradley R. Garris
*Attorney, Agent, or Firm*—Phillips, Moore, Weissenberger, Lempio & Majestic

[57] ABSTRACT

A crystalline dual diamond sodium thallium type intermetallic compound is formed on a substrate surface from lithium and either aluminum, zinc or cadmium. The compound is grown within a magnetic field and, as a result, the compound is formed with a major crystallographic plane thereof aligned generally parallel to the field. Apparatus is disclosed for accomplishing formation of the compound. Silicon may later be grown on the surface of the compound.

28 Claims, 11 Drawing Figures

CADMIUM-ZINC PHASE DIAGRAM

METHOD FOR FORMING A CRYSTALLINE FILM FOR A PARAMAGNETIC SODIUM THALLIUM TYPE INTERMETALLIC COMPOUND

BACKGROUND OF THE INVENTION

1. Field of the Invention

This invention relates generally to a method for forming a crystalline film, and, more particularly, relates to a method for forming a crystalline film of a paramagnetic sodium thallium type intermetallic compound.

2. Prior Art

Crystalline films may generally be formed of those elements and compounds which form bulk crystals. The formation of crystalline films on crystalline substrates of the same material is denoted homoepitaxy. The formation of crystalline films on crystalline substrates of a different material is denoted heteroepitaxy. Under special conditions, crystalline films may be formed on amorphous substrates. The formation of crystalline films is a special discipline apart from bulk crystal formation since circumstances and conditions such as substrate composition, substrate crystallinity and orientation, the respective coefficients of thermal expansion, the adhesion of the film to the substrate or the chemical reaction of the film with the substrate, and the geometry of the film, affect film growth and crystal film characteristics. Such crystalline films have utility for electronics applications since they may be outstanding conductors, semiconductors or insulators and can have precisely tailored electrical properties. In addition, they are known to have particularly useful thermal, magnetic and optical as well as chemical properties.

Numerous techniques are available for forming films from the vapor on a solid substrate. These techniques are used more widely than the techniques of liquid phase epitaxy or solid phase epitaxy. Rheotaxy, the formation of a film on a liquid substrate, is not widely used. The techniques for forming films from the vapor state include chemical vapor deposition, vacuum evaporation and its progeny molecular beam epitaxy, and the various types of sputtering such as ion beam, plasma and magnetron sputtering. Refinements in these techniques have increasingly permitted film thickness, deposition rates and film quality to be controlled. Yet, even with refined film formation techniques there is an inherent progression in the difficulty of film formation from production of an amorphous or microcrystalline material to production of a nonaligned polycrystalline material to production of a crystalline film which is a plurality of aligned crystals or a single crystal. And, the formation of crystalline films which are formed of a plurality of aligned crystals, or better yet, of a single crystal of a particular orientation, has only been possible by the use of carefully prepared substrates of the same or a similar material which have an appropriate crystalline lattice exposed on their surfaces. See I. H. Kahn, "The growth and Structure of Single-crystal Films" in *Handbook of Thin Film Technology*, pp 10-1 et. seq.

The intermetallic compounds of the sodium thallium type are disclosed in U.S. Pat. No. 4,042,447, and in copending application Ser. No. 789,566, now U.S. Pat. No. 4,115,625, as serving as a substrate for the oriented crystalline overgrowth of silicon. The sodium thallium type intermetallic compounds have a dual diamond crystalline lattice in which the constituent atoms of one element form a diamond lattice which is interpenetrated by a slightly displaced but congruent diamond lattice formed by the constituent atoms of the other element. When crystalline silicon is nucleated and grown on a sodium thallium type substrate the recovered product is suitable as a precursor for photovoltaic devices. The nucleation and growth of silicon can be accomplished on a crystalline specimen which is grown from the bulk. However, for a practicable process it is desirable to nucleate and grow crystalline silicon on large surface areas to produce large area photovolatic devices. The formation of crystalline films of sodium thallium type intermetallic compounds and especially of crystalline films with specific orientation is, therefore, a desirable goal.

SUMMARY OF THE INVENTION

Accordingly, it is an object of the present invention to provide a method and apparatus for forming a crystalline film of a sodium thallium type intermetallic compound.

It is a further object of the present invention to provide a method and apparatus for forming a crystalline film with a specific orientation, said crystalline film being formed of a paramagnetic sodium thalluim type intermetallic compound.

It is another object of the present invention to produce an oriented film of a paramagnetic sodium thallium type intermediate compound by applying a strong magnetic field to layers containing the constituent elements in substantially stoichiometric proportions to form the compound with the dual diamond crystal structure in at least a portion of the layer.

In accordance with the present invention a method is provided for forming a crystalline dual diamond sodium thallium type intermetallic compound upon a substrate surface. The method comprises positioning a substrate having upon a surface thereof a region which consists essentially of metallic lithium and a single species selected from aluminum, zinc and cadmium in a substantially stoichiometric amount to form either LiAl, LiZn or LiCd upon said surface, in a magnetic field at a selected angle to said surface, and heating the positioned layer for a sufficient time and at a sufficient temperature to form said intermetallic compound with a major crystallographic plane thereof aligned generally parallel to said field.

In another sense, the invention relates to apparatus for carrying out the aforedescribed method.

BRIEF DESCRIPTION OF THE DRAWINGS

The invention will be better understood by reference to the figures of the drawings wherein like numbers denote like parts throughout and wherein.

DESCRIPTION OF THE PREFERRED EMBODIMENT

Theory

The method of the present invention is based upon the practical utilization of the relationship between the paramagnetic properties of certain intermetallic compounds of the sodium thallium type and their crystal structure. In particular, the paramagnetism of these compounds is utilized by applying a strong magnetic field during the process of crystallization or recrystallization to assist crystallization of a film with a principal crystallographic plane in aligned relation to the applied field. The ensuing description of the preferred embodiments necessarily describes the nature of this paramagnetism, the crystal structure of the sodium thallium type intermetallic compounds and the way in which the application of a strong magnetic field can be used to assist the crystallization of a film with such an orientation.

The three principal magnetic phenomena in matter are paramagnetism, diamagnetism and ferromagnetism. See, generally, D. E. G. Williams, *The Magnetic Properties of Matter* (1966). The first two properties are possessed by individual atoms, ions, or molecules, and relate to magnetic moments which may be inherent or induced. The strength of these properties is determined by the resultant magnetic moment measured in an applied field; this resultant moment necessarily constitutes the sum of the inherent moment and any induced moment. If this resultant magnetic moment in an applied field is greater than without the applied field, the resultant moment is positive, and the substance is paramagnetic; if the resultant magnetic moment is less than in the absence of an applied field, the resultant moment is negative and the substance is diamagnetic. The strength of these properties in elements and inorganic compounds, as reflected by the magnetic susceptibility varies generally from the order of 1 to $10{,}000 \times 10^{-6}$ cgs units for paramagnetic substances (a few rare earth elements have even stronger paramagnetism) and from the order of $-100 \times 10^{-6}$ to the order of $-1 \times 10^{-6}$ cgs units for diamagnetic substances. On the other hand, the property of ferromagnetism is based on cooperative phenomena involving groups of atoms. The strength of the ferromagnetic property is many orders of magnitudes greater than that of paramagnetism and diamagnetism. Further, not only is the magnetic susceptibility much greater but ferromagnetic substances possess the property that a significant remnant magnetization can be produced by the application of a low strength magnetic field whereas, e.g., in paramagnetic substances even when high magnetic fields are applied at most a negligible remnant magnetization is produced. It is the property of remnant magnetization which accounts for the widespread exploitation of the property of ferromagnetism in practical production processes, see, e.g., U.S. Pat. Nos. 4,003,768 issued to R. L. Anderson et al and 2,965,525 issued to R. D. Burbank et al. The absence of any significant remnant magnetization in paramagnetic materials similarly accounts for the absence of exploitation of the properties of paramagnetism.

It has been recognized that the processes that underlie crystallization have a magnetic character. At the inter-atomic level when crystallization occurs the magnetic field strengths are on the order of $10^7$ to $10^8$ oersted. For this reason it has long been the conventional wisdom that external magnetic fields, at the practical levels of the order of $10^2$ to $10^5$ oersted, could not be used to influence the actual process of crystallization. It has been thought that only the high susceptibilities of ferromagnetic materials have practical applications. See Peter Wilkes, *Solid State Theory in Metallurgy*, p. 100 (1973). Thus, so-called magnetic annealing of ferromagnetic substances normally involves only the alignment of ferromagnetic moments and not the processes of crystallization of recrystallization. At most, in certain applications fully formed crystallites of ferromagnetic materials are aligned to form a cohesive solid; these crystallites were formed at the atomic level without the assistance or inducement of an external magnetic field and were ordered at a macroscopic level by magnetic annealing below the Curie temperature to form, e.g., a permanent magnet. See U.S. Pat. No. 2,569,468, issued to E. A. Gangler. When crystallographic texture has been produced in ferromagnetic materials the texture has resulted from group interactions, the basis of ferromagnetism, and not from atomic alignment. See C. D. Graham, Jr., "Textured Magnetic Materials" Berkowitz, et al., *Magnetism and Metallurgy*, Vo. 2, p. 744 et seq. The conventional wisdom that the magnetic properties of paramagnetic materials are of no commercial importance, then, has resulted from a focus on ferromagnetic materials, commonly called "magnetic materials", and a neglect of the magnetic properties of paramagnetic materials, commonly called "nonmagnetic materials". The method of the present invention is predicated upon the use of the paramagnetic properties of certain intermetallic compounds of the sodium thallium type to assist at the atomic level in the oriented crystallization of a film of the compound.

THE PRESENT INVENTION

By reference to Table 1 the approximate molar magnetic susceptibility of the NaTl-type intermetallic compounds can be seen.

TABLE 1*

| Intermetallic Compound With 50 Atomic Percent of Each Element | m × 10⁶ |
|---|---|
| NaTl | −100 |
| LiIn | −29 |
| LiGa | −13 |
| LiZn | 15 |
| LiCd | 7 |
| LiAl | 2 |

This table is excerpted from Y. L. Yao, Trans. AIME, V. 230, p. 1725 (1964) and von W. Klemm et al., Z. Anorg. Allegm. Chem., V. 282, p. 161 et seq. (1955). The compounds LiZn, LiCd and LiAl are paramagnetic while the compounds NaTl, LiIn and LiGa are diamagnetic. In many paramagnetic substances the property has been found to be inversely dependent on temperature. However, the paramagnetism of LiZn, LiCd and LiAl has been found to be almost independent of temperature. von W. Klemm, "Uber das magnetische Verhalten der intermetallischen Phasen Vom NaTl-Typ", Z. Anorg. Allgem. Chem., V. 282, p. 162 et seq. (1955). The resultant magnetic moment of these compounds in an applied magnetic field is greater than the amount without the applied field. On an atomic level this means that certain electrons experience changes in their orbital motion in the presence of the applied field and these changed orbits in turn produce an associated magnetic moment which seeks alignment with the field. At a submicroscopic level nuclei of two or more atoms will seek alignment with the applied field in such an orientation that these induced magnetic moments will be in line with the applied field. These induced moments exist in an environment of thermal kinetic forces and interatomic magnetic forces, and, subject to their interaction with these environmental forces, will naturally seek alignment with the external field. It is this tendency to alignment of the paramagnetic moments at the atomic and submicroscopic level in the three paramagnetic sodium thallium type intermetallic compounds which is relied upon by the method of the present invention. The three diamagnetic intermetallic compounds, NaTl, LiIn and LiGa, do not tend to align with the external field; instead, the forces related to the resultant moments tend to rotate the atoms and submicroscopic nuclei away from alignment with this field. This introduces unstabilizing rotational motion inimical to crystallization. With certain simple crystal structures with pronounced orthogonal diamagnetic anistropy, such as graphite, magnetic field enhancement of crystallization may occur. With the diamagnetic sodium thallium dual diamond crystal structure, however, the symmetry of the principal crystallographic planes is such that rotation continually turns other principal crystallographic axes into the direction of the applied field thus producing further rotational forces which result in a tumbling effect. The reliance of the method of the present invention on the paramagnetic compounds and the exclusive of the diamagnetic compounds is collaterally supported by the observed crystallization of paramagnetic and diamagnetic substances from solutions in the presence of a magnetic field. G. E. Smerkovich-Galevy, "Effect of Magnetic Field on Crystallization", Zhurnal Vsesoyuznogo Khimicheskogo Obshchestva Imeni DI Mendeleeva, v. 22, p. 102 et seq. (1977).

The crystalline, and particularly the single crystal state is the energetically preferred state; however, conditions must be carefully controlled for this state to be obtained. The presence of impurities, inappropriate cooling rates and pressure levels, non-optimum geometries and other factors will introduce forces which work against the formation of aligned crystals and particularly of single crystals. If these forces are eliminated or damped, the aligned crystalline state can be preferentially obtained over, e.g., the non-aligned macrocrystalline state or the microcrystalline or amorphous state. A key to the establishment of the aligned crystalline state is the alignment at the atomic and submicroscopic level of the constituent atoms or nuclei in an arrangement which permits the interatomic magnetic forces to take over and coalesce the constituent atoms and nuclei into a crystal. As the principal crystallographic axis of a fully formed paramagnetic crystal lines up with an applied magnetic field because of the concentration of magnetic moments in the plane of the principal crystallographic axis, the application of an external field during crystallization aligns paramagnetic moments of atoms and the paramagnetic based moments of submicroscopic nuclei so that one of the major and generally the principal crystallographic plane coalesces in alignment with the field. If there are symmetrical counterparts of the principal crystallographic plane this coalescence will be more likely to occur if the plane being formed in alignment with the field is in some manner distinguishable from its symmetrical counterparts, i.e., if it is anisotropic, and if alignment at the atomic level lies in this particular plane. It should be noted that in the sense of this invention the crystals formed may indeed be quite small so long as they are aligned as discussed herein. When such alignment is present, properly oriented silicon overgrowth can occur.

Figures 1, 1A, 2:
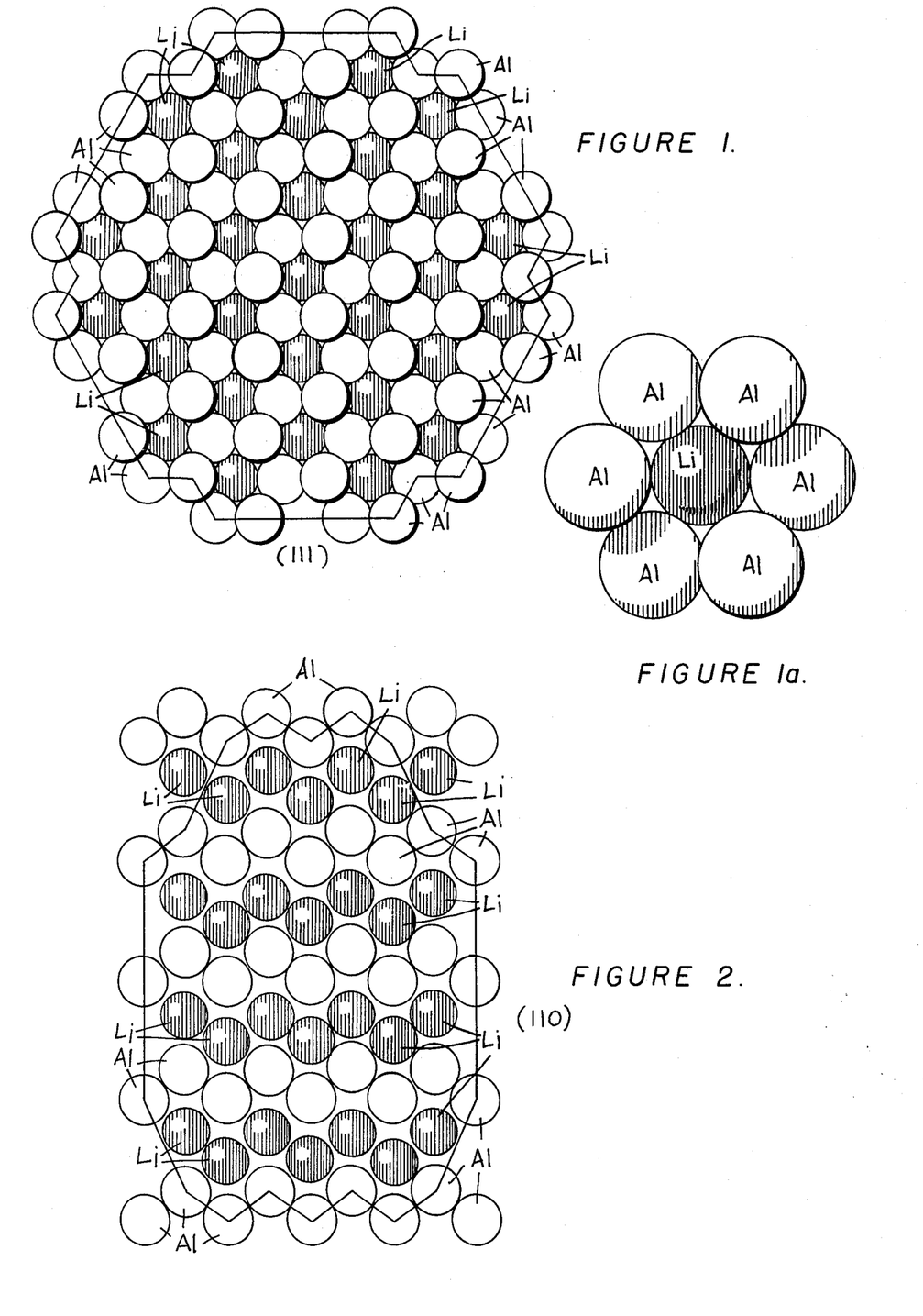
FIG. 1 illustrates schematically a principal major (111) plane of a double diamond sodium thallium type lithium aluminum crystal.
FIG. 1a illustrates in enlarged view a portion of the crystal of FIG. 1.
FIG. 2 illustrates schematically a major (110) plane of a double diamond sodium thallium type lithium aluminum crystal.
Figure 1B:
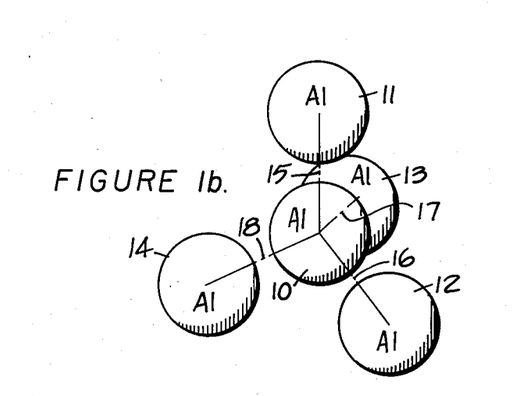
FIG. 1b illustrates schematically a tetrahedron of aluminum atoms.
Figure 3:
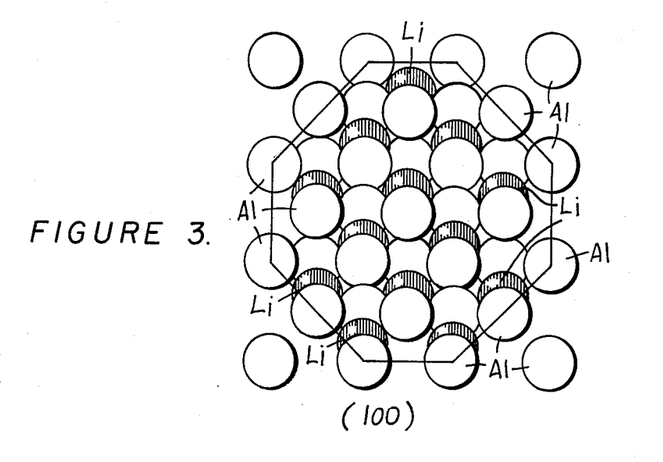
FIG. 3 illustrates schematically a major (100) plane of a double diamond sodium thallium type lithium aluminum crystal.

The crystal structure of NaTl type intermetallic compounds is dual diamond. The atoms of one element, e.g., Al, when considered together, form a diamond lattice, and the atoms of the other element, e.g., Li, when considered together form a second diamond lattice. The two lattices interpenetrate one another. See, e.g., U.S. Pat. No. 4,042,447 issued to the applicant herein. In the basic diamond and dual diamond lattices, as can be seen by reference to FIG. 1b each Al atom 10 lies at the center of a tetrahedron with the four nearest Al neighbors 11, 12, 13 and 14 lying at the corners. The four-fold covalent-type bonds 15, 16, 17 and 18 are made, respectively, with the four nearest Al neighbors 11, 12, 13 and 14. In basic diamond crystal structures the constituent elements carbon (diamond), silicon, germanium and grey tin, have four electrons available to share respectively, with the four neighbors. When this symmetry is perpetuated by open-ended three dimensional growth with the Li lattice interpenetrating the Al lattice, the crystal structure of FIGS. 1, 1a, 2, 3 and 4 is formed with the lighter spheres representing Al and the darker spheres representing Li. The principal crystallographic plane is the (111) plane shown in plan view in FIG. 1 and in cross-section view in FIG. 4. This principal plane contains significant projections of three of the four bonds with the remaining bond being orthogonal to the plane; the next most significant planes, respectively, are the (110) and the (100) planes whose surface configurations are shown in FIGS. 2 and 3. These three planes thus are the major crystallographic planes of the diamond and dual diamond lattices. Due to the four-fold symmetry, the (111) plane is repeated three additional times at three different rotations through 120°. A perfect crystal of the diamond structure would be an octahedron with these four planar surfaces and their mirror images forming the eight facets; in gem quality diamonds and in solid single crystal silicon surfaces, degeneracy at the corners often produces additional faceting. However, the (111) plane is clearly the principal plane. It possesses the highest atom density as well as the highest bond concentration of any crystollographic plane in the diamond and dual diamond lattices. In electromagnetic terms it has the highest electron current through the plane and the highest potential for paramagnetic moments to be formed in-the-plane of any crystallographic plane. Yet in silicon diamond, germanium or grey tin, the properties of this plane are not unique since it is repeated four times in a single crystal. Each of these four planes is identical in its crystal structure and in its electrical and magnetic properties to each of the others. Thus, there is no anisotropy as between these planes. In addition, even if there were any anisotropy as between these planes, the materials are diamagnetic and the diamagnetic property is not useful in establishing order or submicroscopic level to assist in oriented crysstallization in view of the tumbling effect previously described.

In the dual diamond structures of the LiZn, LiCd and LiAl intermetallic compounds a given (111) plane of, e.g., the Al atoms, is distinguishable in the presence of a magnetic field from the other three structurally similar planes due to paramagnetic anisotropy. In the presence of an external magnetic field the concentration of paramagnetic moments in the (111) plane which form in alignment with the field will distinguish it from the three other (111) planes. In microscopic crystallites of LiAl the three valence electrons from Al preferentially contribute to the bonds with significant projections in this plane; the electron contributed by Li will preferentially form the bond orthogonal to the plane which is in alignment with the field. In addition to alignment at the crystal level due to paramagnetic anisotropy, since atomic Al is paramagnetic, individual Al atoms will align with the applied field before they join the growing crystal or join together to form a submicroscopic nucleus. The Al atoms thus are properly oriented to fit where they belong. Similarly, submicroscopic nuclei or clusters come to the growing crystal with proper orientation. The paramagnetism of Li may also contribute to the oriented crystallization. With LiZn and LiCd the paramagnetic anisotropy is less pronounced at the crystal level since the sharing is of the Pauli type and therefore more complex; also, there is no cooperative effect at the atomic level since both Cd and Zn are individually diamagnetic. With LiAl paramagnetic anisotropy at the crystal level along with atomic paramagnetism leads to crystallization of the (111) plane in alignment with (parallel to) the applied field. The external field neither provides the energy for crystallization nor forces bonding to occur in a particular orientation. Rather, it affects those atoms, submicroscopic nuclei and crystallites which are free to rotate, i.e., are not then engaging in strong inter-atomic magnetic interactions, by inducing paramagnetic moments which tend to rotate the atoms, submicroscopic nuclei and crystallites into alignment with the field subject to the opposition of the thermal kinetic forces. The inter-atomic magnetic forces then control crystallization. The preferred embodiment of the method of the present invention, then, is to form a crystalline film of LiAl with its (111) crystallographic plane in alignment with an external magnetic field.

With the sodium thallium type intermetallic compounds the cooperative interaction of the electrons of the two constituent elements permits a bonding arrangement akin to the four-fold covalent bond in conventional diamond crystal structures. For example, Al, which is in column III of the periodic table and normally has three valence electrons, by itself would bond together in a face centered cubic lattice. The cooperative interaction with Li allows it to enter the diamond type crystal structure. The exact nature of the cooperation is disputed. See M. B. McNeil, et al., "Stabilization and Chemical Bonding in Zintl Phases", J. Phys C: Sol. St-Phys, v. 6, 1 (1973). For the purpose of the method of the present invention it is sufficient to understand that the crystal structure of each constituent element is identical to that of diamond in its geometrical arrangement and that the heavier element has a preponderance of the bonding charge. The Li atoms, it may be said, are caught in the interstices of the lattice of the heavier element; alternatively, it may be said that the Li atoms are positioned propitiously so as to allow the valence electron of each Li atom to double as the fourth valence electron for a respective Al. From a bonding perspective, then, LiAl, LiZn and LiCd can be considered as having a diamond type crystal structure comprising Al, Zn and Cd, respectively, with interstitial Li which contributes additional bonding charge.

Figure 4:
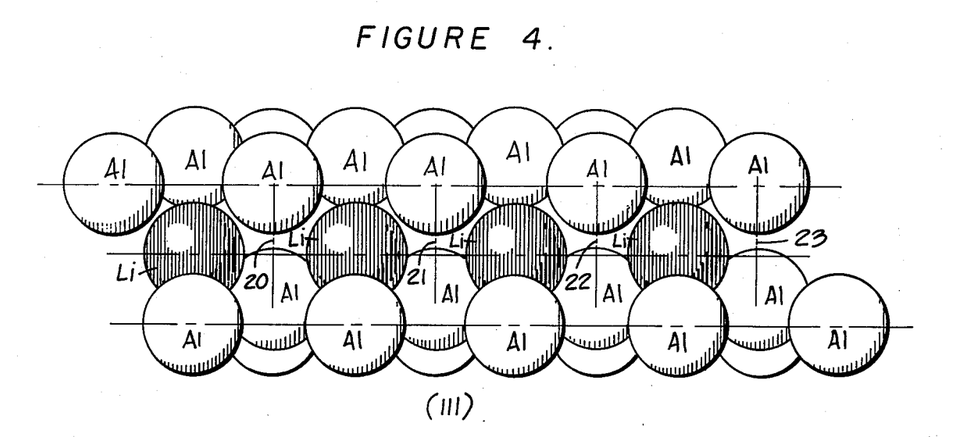
FIG. 4 illustrates an elevation view of the crystal of FIG. 1.

By reference to FIG. 4 it can be seen that the dual diamond structure perpetuates the symmetry of the diamond lattice by a three dimensional congruency of the constituent lattices. Thus, the (111) plane of, e.g., Al is parallel to the (111) plane of Li. In effect, a layered type structure is obtained when the (111) plane is considered; a layer that is principally aluminum is separated by a layer that is principally Li. This layered effect introduces a paramagnetic anisotropy, analogous to the diamagnetic anisotropy in graphite and antimony, which is utilized in the method of the present invention to assist in oriented crystallization.

As will be seen from FIG. 4, two Li atoms bracket each Al—Al bond, e.g., bonds 20, 21, 22 and 23 which are orthogonal to the (111) plane. These two atoms are able to contribute bonding charge to this bond when a magnetic field is applied and the three Al electrons form tha bonds in the (111) plane. Each of the three counterpart planes which have the same crystal symmetry and atom density will only have two of the three Al electron bonds. In addition, the preconditions for crystallization, oriented atoms and submicroscopic nuclei, are only found in the plane aligned with (parallel to) the applied magnetic field. The (111) plane forms in alignment with the external field since the preconditions exist for nucleation and growth and paramagnetic anisotropy keeps the growth in the plane. The resultant dual diamond LiAl structure is much like a structure of Al planes adhered together by interstitial Li planes. The institial Li planes have the Li properly positioned so as to contribute to the bonding of Al plane to Al plane.

The inter-atomic and microscopic interaction of the paramagnetic sodium thallium compounds with an external magnetic field are consistant with the interactions of paramagnetic crystals with an external magnetic field. Tyndall in his classic experiments on the magnetic properties of naturally occuring mineral crystals established in *On Diamagnetism and Magnetrocrystallic Action* (1870) that a rotatably mounted single mineral crystal of a paramagnetic substance sought alignment of a principal crystallographic plane with the applied field. In essence the denser packing in the principal crystallographic plane placed a preponderance of the small paramagnetic moments in a single plane so that this plane tended to align with the applied field in preference to any other plane in the crystal. On the other hand, Tyndall demonstrated that a rotatably mounted naturally occuring single crystal of a diamagnetic substance does not seek alignment along a principal crystallographic plane. Rather, alignment of the fully formed crystal occured perpendicular to a principal crystallographic plane. This property of a fully formed paramagnetic crystal is consistant with the interaction at the atomic level which is relied upon by the method of the present invention. In addition, the rotational motion which produces instability attributed herein to the diamagnetic compounds is confirmed.

The method of the present invention produces a film of one of the paramagnetic intermetallic compounds of the sodium thallium type. The term film is used in the general sense of non-bulk, i.e., in the sense of a layer which is produced at the site or in the configuration in which it will be used, as opposed to a crystal which is grown in bulk and subsequently sawed before being used. The term film includes a thin film produced on a dissimilar substrate, a layer produced on a planar or on a curved substrate, a surface layer produced as a continuation of a solid substrate such as a LiAl surface layer on an aluminum sheet, or a layer of the intermetallic compound formed from the melt, i.e., a cast sheet, to which silicon is applied directly. The substrate on which the layer is formed may be ceramic, metal or other suitable material which does not react in an undesirable manner with the layer. The substrate may, e.g., affect the crystallographic plane which aligns with the applied field. Thus, while the preponderance of substrate materials the (111) plane forms in parallel alignment with the applied field, the selection of a titanium substrate may lead to the alignment of the (110) plane with the applied field; however, selection of suitably higher field strengths can override the effect. See L. M. Eprath, "Growth of Polycrystalline Silicon Films on Titanium and Aluminum Layers". J. of Electronic Material, V. 4, p. 1207 (1975). The layer may be applied to the substrate in sandwich form (see H. Kezuka et al., "Study of NaTl Type $I_aIII_b$ Li Compounds Prepared by the Sandwich-Type Evaporation Method", Thin Solid Films, V. 30, p. 11 et seq. (1975), Li may be implanted into the upper surface region of a solid substrate of Al, or Li may be dissolved in liquid aluminum with LiAl crystalizing out.

Figure 5:
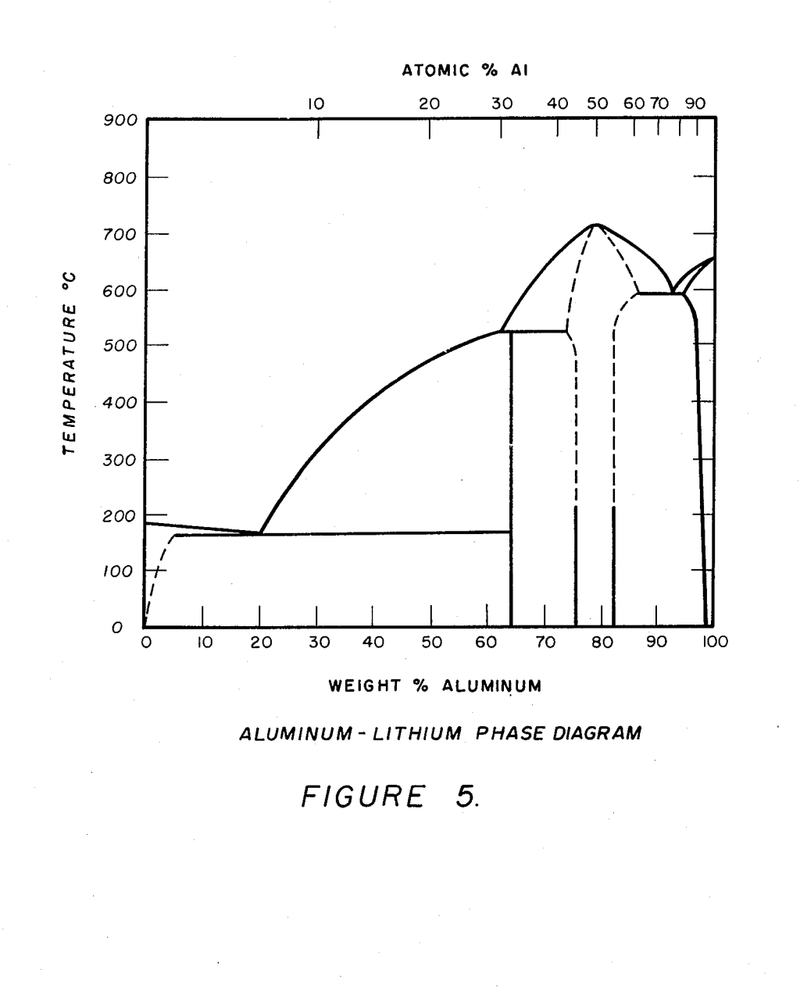
FIGS. 5, 6 and 7 illustrate respectively the phase diagrams of lithium and aluminum, lithium and zinc, and lithium and cadmium.
Figure 6:
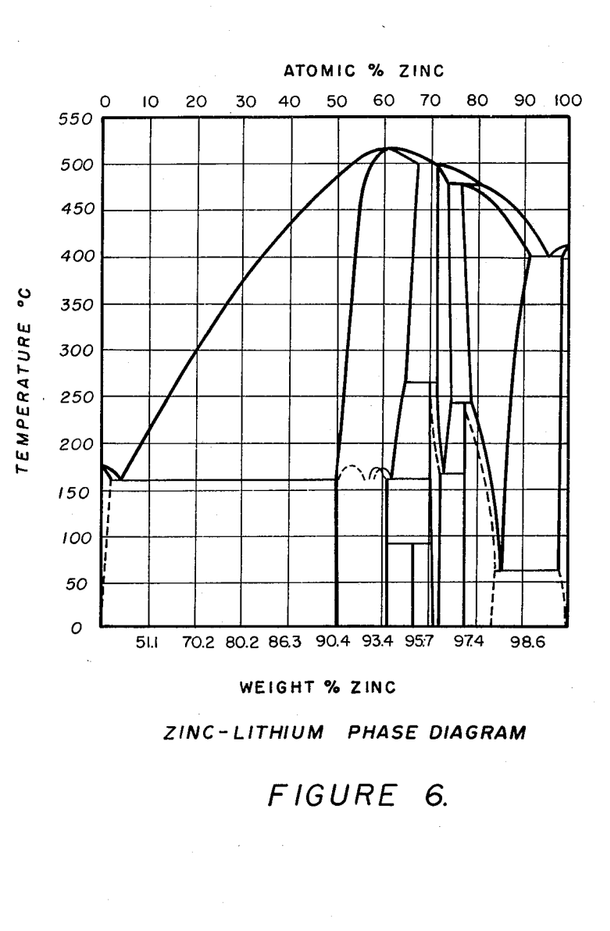
Figure 7:
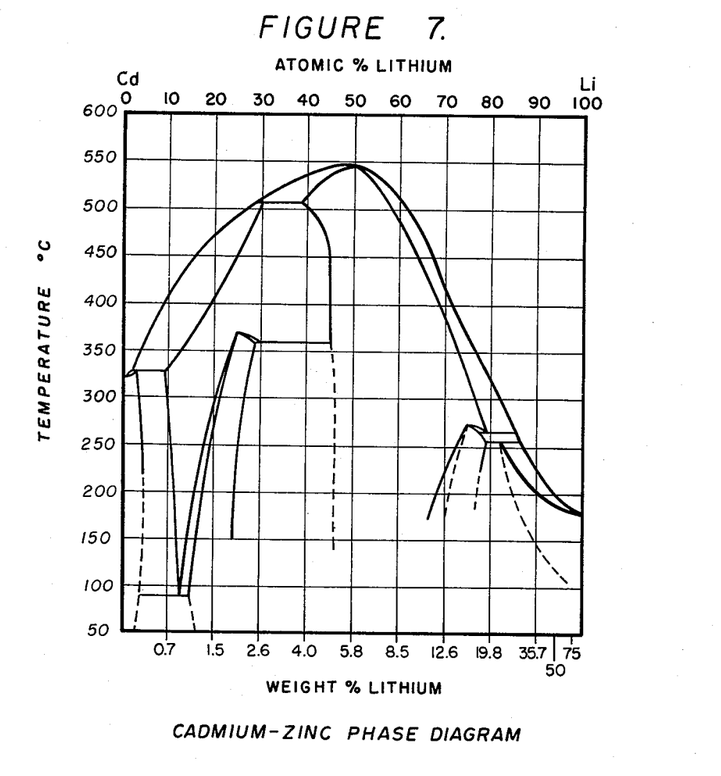

The constituent elements are supplied to the layer in the appropriate proportions to permit the intermetallic compound with the sodium thallium dual diamond crystal structure to be formed in at least a portion of the layer. This proportionality may vary over a range to permit, e.g., a nonstoichiometric portion of the layer to be removed in a cleaning step or to permit a compound slightly deficient in one of the constituent elements to be formed. The three compounds are stable and homogeneous for a range of at least 5 to 20 percent about the stoichiometric ratio and hence the term substantially stoichiometric as used herein is meant to include this range. For example, the LiAl lattice is found to be especially stable when there are 2.7% vacancies at the Li sites (the equivalent of about 48.7 atomic percent of Lithium). See H. E. Schone, et al., "Nuclear Magnetic Resonance in Intermetallic Compounds", Acta Metallurgica, Vol. 11, p. 179 (1963). Since this lattice has greater paramagnetism, it is in fact preferred over the stoichiometric lattice in practicing the method of the present invention. From the phase diagram of FIG. 5 it can be seen that LiAl is stable from about 45 atomic percent lithium to about 55 atomic percent lithium. From FIG. 6 it can be seen that LiZn is stable from about 50 percent lithium and up at low temperatures and from about 43 atomic percent lithium to the eutectic curve at higher temperatures. An from FIG. 7 is can be seen that LiCd is stable from about 45 to about 70 atomic percent lithium. The method of the present invention may be practiced over these ranges since the desired crystal structure is obtained.

The intermetallic comounds are energetically preferred and hence form readily even at temperatures well below their eutectic temperatures with somewhat longer times being needed at somewhat lower temperatures. For example, polycrystalline LiAl has been formed by evaporation at 350° C. and annealing at 350° C. for more than 90 minutes, H. Kezuka, et al., "Study of NaTl-Type $I_aIII_b$ Li Compounds Prepared by the Sandwich-Type Evaporation Method", Thin Solid Films, Vol. 30, p. 11 (1975). As can be seen from Table II the melting points of the intermetallic compounds are greater than the melting points of the heavier element (Li melts at 180.5° C.)

TABLE II

| Heavier Element | Melting Points | | Intermetallic Compound |
|---|---|---|---|
| Zn | 419° C. | 470° C. | LiZn |
| Cd | 321° C. | 549° C. | LiCd |
| Al | 660° C. | 718° C. | LiAl |

In a preferred embodiment of the present invention the strong magnetic field is applied to the layer in the temperature range between about the eutectic temperature of the compound and about the temperature at which the heavier metal melts; with LiAl, for example, the preferred temperature range is from about 660° C. to about 718° C. This preferred embodiment may be practiced by cooling down through the eutectic or by cooling in the solid state in the middle regions of the range. Since the intermetallic compounds are not ferromagnetic there is no Curie point above which magnetic treatment cannot be applied. The crystal structure, not remnant magnetization, is the objective and this is preferably reached by applying a magnetic field in this range. The method of the present invention has utility as well at lower temperatures since the three compounds are highly energetically preferred and experience oriented recrystallization in the presence of the strong magnetic field. In general, however, the higher the temperature the better the quality of the crystalline film.

The paramagnetic susceptibilities of LiZn, LiCd and LiAl as shown previously in Table I are much smaller than the susceptibilities of ferromagnetic materials, e.g., Fe, Ni, or Co. Thus, a strong magnetic field should preferably be used, one that is greater than needed to magnetically saturate ferromagnetic materials. It is to be remembered as well that it is the property of paramagnetic anisotropy at the crystal field level and the paramagnetism of atoms and submicroscopic nuclei that are relied upon to influence the crystallographic order; the principal crystallographic plane e.g., the (111) plane, is the preferred plane to align with the externally applied magnetic field. This externally applied field should be high enough for a given temperature and anneal time to result in crystallization of the (111) plane in alignment with the field. In a preferred embodiment this field is greater than 1000 Oe. In a still more preferred embodiment the field strength is at least about 5,000 Oe in order to assure positive alignment in the face of thermal kinetic and geometric forces. Allowance must be made for those environments in which the layer is shielded, e.g., by a matallic substrate which is thick in comparison to the layer; in such environments even greater fields must be generated to produce the desired field strength within the layer. The preferred fields produce better quality crystalline material and higher rates of crystallization. Practical fields of these strengths are produced by wire wound electromagnets well known in the art. Direct current electromagnets are preferred as they are able to produce steady magnetic fluxes at reasonable cost and can be scaled up to meet production requirements.

The strong magnetic field may be applied at any selected angle with respect to the plane or curvature of the layer. In thin films there is a tendency for principal crystallographic planes to form in the plane of the film so relatively greater field strengths are required to produce, e.g., the (111) crystallographic plane perpendicular to the layer, than in the plane or congruent with the curvature of the layer. Normally the applied magnetic field will override the geometrical effects but in certain instances with moderate field strengths and high geometrical effects the crystallographic plane which is formed is slightly off alignment with the applied field due to this effect. In a preferred embodiment the geometric effect is combined with the magnetic field enhancement method of the present invention to produce the (111) crystallographic plane in the plane or congruent with the curvature of the layer. This embodiment permits the silicon applied subsequently to be applied in the same plane so that incident photons will strike the (111) silicon plane; in silicon this will minimize the channeling effect in the incident photons and is preferred. In addition, a 6×6 surface array on LiAl will accommodate with less than 1% mismatch the naturally occuring 7×7 surface structure of (111) silicon. In another embodiment the magnetic field and the layer are made to move relatively across one another to produce an effect akin to the temperature gradient in float zone crystal growth. See K. Kuriyama, "Bridgman Growth of Lithium Indium Single Crystals", J. Cryst. Growth, Vo. 23, p. 160 (1974). Either the magnet or the layer can be moved relative to the other as in a continuous moving sheet having a layer exposed to a wire wound iron core magnet and moved relative thereto as is described below with reference to FIGS. 8 and 9.

The method of the present invention is practiced in a moderate vacuum on the order of $10^{-3}$ Torr or lower. Lithium and the intermetallic compounds LiAl, LiZn and LiCd are not highly reactive but they will oxidize and are particularly reactive with water vapor. It is preferred that the vacuum not be broken prior to the application of silicon by, e.g., magnetically enhanced sputtering or other vapor phase deposition technique. The starting materials may be on the order of 99.9 percent pure, i.e., they need not be as pure as the silicon itself, since as described above the surface of the film can be processed prior to the application of silicon to remove impurities and to provide a suitable surface for nucleation and growth of crystalline silicon.

APPARATUS OF THE INVENTION

Figure 8:
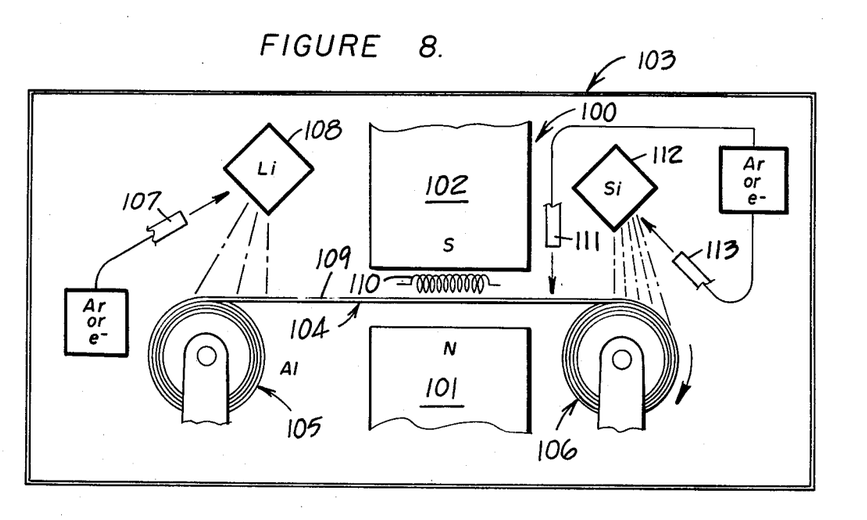
FIG. 8 illustrates schematically a first embodiment of apparatus in accordance with the present invention.

Adverting to FIG. 8, there is illustrated therein a first embodiment of apparatus in accordance with the present invention which is particularly designed for carrying out the above described method. Briefly, an electromagnet 100 having a North pole 101 and a South pole 102 is positioned within a vacuum chamber 103. A sheet of aluminum (or zinc or cadmium) 104 is fed from a feed roll 105 to a take up roll 106 with the sheet 104 passing between the poles 101 and 102 and forming an angle of generally 90° with the magnetic field created by the poles. It should be noted that a plate of aluminum can replace the sheet 104 with appropriate feed means substituting for the rolls 105 and 106. Argon ions are electrons from a source 107 are directed against a supply 108 of lithium whereby through conventional sputtering techniques lithium ions leave the lithium supply 108 with considerable energy and impinge upon a surface 109 of the sheet 104. Because of the relatively high energy of the lithium ions they penetrate the surface 109 and are implanted within a top region below the surface 109. As the sheet 104 is swept through the field the top region thereof, which has lithium and aluminum in substantially stoichiometric amounts for the formation of LiAl, it is heated by heater 110 to a sufficient temperature and for a sufficient time to crystallize the LiAl with a principal (111) plane thereof generally parallel to the field. As the sheet 104 approaches the take up roll 106, argon ions or electrons from a source 111 are impinged on the uppermost portion of the LiAl thus conventionally sputter etching off a fraction of the uppermost portion of the LiAl to remove surface impurities and provide an effective surface for nucleation and growth of silicon which can then be conventionally impinged onto the cleaned LiAl by any vapor phase deposition technique, for example, by impinging argon ions or electrons onto a silicon supply 112 from an ion or electron source 113 or by other conventional techniques such a those discussed in U.S. Pat. No. 4,042,447.

It will be noted that in the embodiment of the apparatus just described LiAl is formed with a principal crystallographic plane parallel to the applied field due to the influence of that field. This orientation is attained against the tendency of a principal crystallographic plane to form in the plane of the film (region) of lithium and aluminum on the surface 109, which tendency, due to the 90° orientation of the sheet 104 relative to the field, would normally tend to produce orientation of a principal crystallographic plane perpendicular to the field.

ALTERNATE EMBODIMENT

Figure 9:
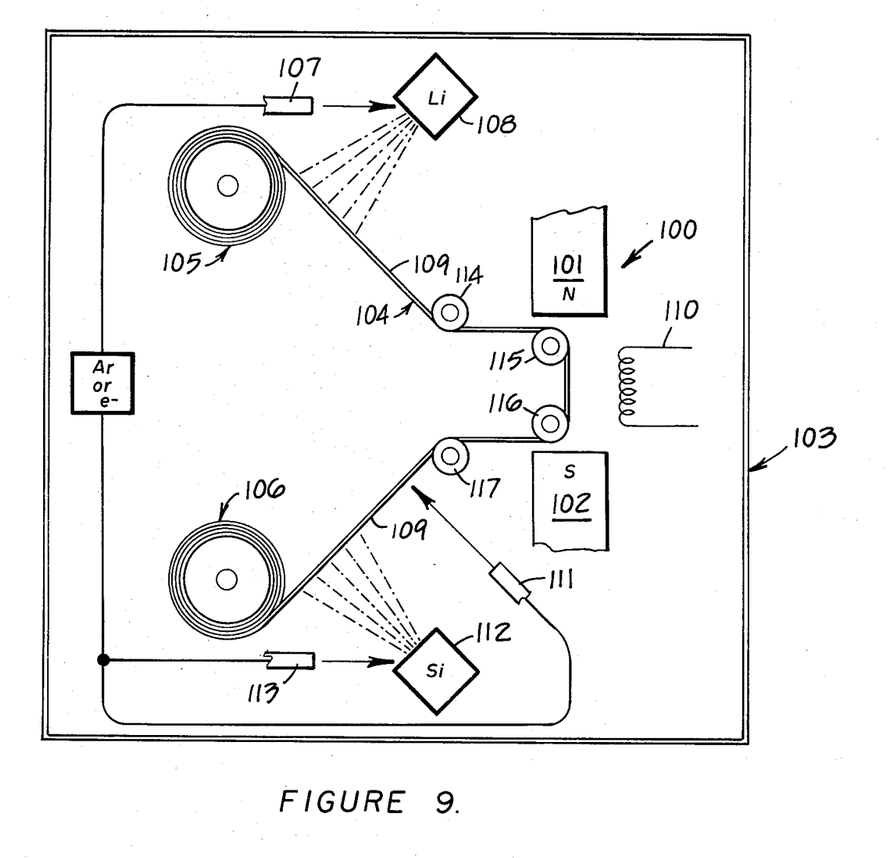
FIG. 9 illustrates schematically an alternate apparatus to that of FIG. 8.

Adverting now to FIG. 9, there is illustrated therein a second embodiment of apparatus in accordance with the present invention. In the apparatus of FIG. 9, the magnetic field is aligned during heating of the lithiumaluminum region or film, generally parallel to the surface 109 of the sheet 104. Thus, the natural tendency of a principal crystallographic plane to form in the plane of the film of crystallizing material is used additively with the effect of the field.

Briefly, the sheet 104 passes from an upper roll 105 to a lower roll 106 and is guided by rollers 114, 115, 116 and 117 into the field between the poles 101 and 102 of the magnet 100. The rollers 115 and 116 are vertically separated from one another so that the surface 109 is parallel to the field when opposite the heater 110. It should be noted that this configuration allows the use of smaller pole faces on the magnet 100 and easy application of heat from the heater 110 which is kept out of any direct physical contact with the poles 101 and 102. It should further be noted that while terms such as upper, lower and vertical have been used to explain the embodiment of FIGS. 8 and 9, these terms have been used for convenience only and the entire apparatus can be rotated into any orientation and still retain its full usefullness.

While the invention has been described in connection with specific embodiments thereof, it will be understood that it is capable of further modification, and this application is intended to cover any variations, uses or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

That which is claimed is:

1. A method for forming a crystalline film of a paramagnetic sodium thallium type intermetallic compound having a dual diamond crystal structure, comprising the steps of:
   providing a substrate;
   producing a layer on one surface of said substrate, said layer containing the constituent elements of said compound in substantially stoichiometric proportions to permit formation of said compound with the dual diamond sodium thallium type crystal structure in at least a portion of said layer;
   applying a magnetic field to said layer, said magnetic field having a selected orientation with respect to the orientation of said layer and having a strength sufficient to induce crystallization of a major crystallographic plane in aligned relation thereto; and
   heating said layer in the presence of said field at a sufficient temperature to permit crystallization to occur with a major crystallographic plane of said compound in aligned relation to the orientation of said magnetic field.

2. A method for forming a crystalline film in accordance with claim 1 wherein said step of producing a layer is accomplished by the step of producing a layer containing lithium and zinc on one surface of said substrate.

3. A method for forming a crystalline film in accordance with claim 1 wherein said step of producing a layer is accomplished by the step of producing a layer containing lithium and cadmium on one surface of said substrate.

4. A method for forming a crystalline film in accordance with claim 1 wherein said step of producing a layer is accomplished by the step of producing a layer containing lithium and aluminum on one surface of said substrate.

5. A method for forming a crystalline field in accordance with claim 4 wherein said step of producing a layer is accomplished by the step of:
   introducing lithium into the region below the surface of an aluminum substrate.

6. A method for forming a crystalline film in accordance with claim 5 wherein said step of introducing lithium is accomplished by the step of:
   implanting energetic ions of lithium into the region below the surface of an aluminum substrate.

7. A method for forming a crystalline film in accordance with claim 5 in combination with the step, after the step of heating said layer,
   sputtering off a selected porting of the uppermost surface of said crystalline film to remove surface impurities and provide an effective surface for nucleation and growth of silicon.

8. A method for forming a crystalline film in accordance with claim 7, including as an added step:
   vapor depositing silicon on said film after said heating step.

9. A method for forming a crystalline film in accordance with claim 4, including as an added step:
   vapor depositing silicon on said film after said heating step.

10. A method for forming a crystalline film in accordance with claim 4 wherein said step of producing a layer is accomplished by the step of:
    producing a layer on one surface of said substrate, said layer containing lithium and aluminum in the proportions required to form in at least a portion of said layer a lithium deficient structure within which the atomic percent of lithium lies in the range of 47% to 49%.

11. A method for forming a crystalline film in accordance with claim 4 wherein said step of applying a magnetic field to said layer is accomplished by the step of:
    applying a magnetic field to said layer, said magnetic field having an orientation which is parallel with at least a portion of the surface of said layer.

12. A method for forming a crystalline film in accordance with claim 4 wherein said step of applying a magnetic field is accomplished by the step of:
    applying a magnetic field to said layer, said magnetic field having a selected orientation with respect to the orientation of said layer and having a field strength greater than 1000 Oersteds.

13. A method for forming a crystalline film in accordance with claim 4 wherein said step of applying a magnetic field is accomplished by the step of:
    moving said layer relative to a magnetic field.

14. A method for forming a crystalline film in accordance with claim 13 wherein said moving step includes:
    maintaining a fixed orientation of said magnetic field with respect to said layer throughout the moving.

15. A method for forming a crystalline film in accordance with claim 4 wherein said step of heating said layer is accomplished by the step of:
    heating said layer in the presence of said field at a temperature in the range from about 660° C. to about 718° C.

16. A method of forming a paramagnetic crystalline duel diamond sodium thallium type intermetallic compound upon a substrate, comprising:
    positioning a substrate having a region consisting essentially of metallic Li and a single species of an additional metal selected from the group consisting of Al, Zn and Cd in a substantially stoichiometric amount to form either LiAl, LiZn or LiCd on a surface of said substrate in a magnetic field at a selectively set angle to said surface; and
    heating said positioned region to a sufficient temperature and for a sufficient time to form said intermetallic compound with a major crystallographic plane thereof aligned generally parallel to said field.

17. A method as in claim 16, wherein said crystallographic plane is one of the four (111) principal planes.

18. A method as in claim 16, wherein said additional metal is Al.

19. A method as in claim 16, wherein said additional metal is Zn.

20. A method as in claim 16, wherein said additional metal is Cd.

21. A method as in claim 16, wherein said substrate is positioned with said surface thereof substantially parallel to said field.

22. A method as in claim 16, wherein said additional metal is Al and said crystallographic plane is one of the four (111) principal planes.

23. A method as in claim 22, wherein said substrate comprises Al and including:
    forming said layer by impinging energetic lithium ions onto said substrate in a vacuum chamber.

24. A method as in claim 23, including:
    vacuum sputtering off of a selected depth of an outermost surface of said intermetallic compound to remove surface impurities and provide an effective surface for nucleation and growth of silicon thereon.

25. A method as in claim 24, including:
vacuum depositing silicon on said film after said hetaing step.

26. A method as in claim 23, including: vacuum depositing silicon on said film after said heating step.

27. A method as in claim 1, wherein said substrate is other than a sodium thallium type intermetallic compound.

28. A method as in claim 27, wherein said substrate is metallic.